United States Patent
Watanabe (10) Patent No.: US 7,571,416 B2
(45) Date of Patent: Aug. 4, 2009

(54) AUTOMATIC DESIGN DEVICE, METHOD, AND PROGRAM FOR SEMICONDUCTOR INTEGRATED CIRCUITS

(75) Inventor: Atsushi Watanabe, Cupertino, CA (US)

(73) Assignee: Kabushiki Kaisha Toshiba, Tokyo (JP)

( * ) Notice: Subject to any disclaimer, the term of this patent is extended or adjusted under 35 U.S.C. 154(b) by 320 days.

(21) Appl. No.: 11/641,818

(22) Filed: Dec. 20, 2006

(65) Prior Publication Data

US 2007/0174793 A1    Jul. 26, 2007

(30) Foreign Application Priority Data

Dec. 20, 2005    (JP) .............................. 2005-366635

(51) Int. Cl.
 *G06F 17/50* (2006.01)
(52) U.S. Cl. .......................................... 716/18; 716/21
(58) Field of Classification Search ............... 716/8–14, 716/18, 19, 21
See application file for complete search history.

(56) References Cited

U.S. PATENT DOCUMENTS

| | | | |
|---|---|---|---|
| 2003/0200513 A1* | 10/2003 | Bergman Reuter et al. ..... | 716/4 |
| 2005/0166176 A1* | 7/2005 | Watanabe et al. ............. | 716/21 |
| 2007/0136709 A1* | 6/2007 | Rodman ......................... | 716/8 |
| 2007/0294653 A1* | 12/2007 | Bartley et al. .................. | 716/11 |
| 2008/0028352 A1* | 1/2008 | Birch et al. .................... | 716/12 |
| 2008/0046852 A1* | 2/2008 | Bergman Reuter et al. .... | 716/10 |

FOREIGN PATENT DOCUMENTS

| | | |
|---|---|---|
| JP | 10-153851 A | 6/1998 |
| JP | 2003-044534 A | 2/2003 |
| JP | 2005-101620 A | 4/2005 |

\* cited by examiner

*Primary Examiner*—Stacy A Whitmore
(74) *Attorney, Agent, or Firm*—Foley & Lardner LLP (57) ABSTRACT

An automatic design device includes: a calculating section calculating additional geometries added to basic geometries including wiring lines and vias arranged on a chip region; a classifying section classifying the additional geometries into at least an additional graphic required for manufacture and an additional graphic required for circuit characteristics in accordance with a division and characteristics of the additional geometries in order to manufacture the basic geometries on the chip region; and an analyzing section extracting at least one of the additional geometries through the classification result in accordance with a purpose of analysis and analyzes characteristics of the basic geometries.

17 Claims, 10 Drawing Sheets

21~23: WIRING PATTERN
41, 43: VIA
51, 53: WIRING EXTENSION PATTERN
60: DISPLAY SCREEN
62: WIRING REINFORCEMENT PATTERN
72: YIELD ENHANCEMENT WIRING PATTERN

FIG. 4

| CLASSIFI-CATION | CLASS OF GEOMETRY | CHARACTERISTIC OF GEOMETRY | CIRCUIT EXTRACTION | GEOMETRY LIST |
|---|---|---|---|---|
| A | BASIC GEOMETRY | GEOMETRY WHICH IS ACTUALLY PRESENT AFTER MANUFACTURING | NEEDED | WIRING PATTERNS 21 TO 23, VIAS 41 AND 43 |
| B | EXTENSION GEOMETRY | GEOMETRY WHICH IS NOT ACTUALLY PRESENT AFTER MANUFACTURING | NOT NEEDED | WIRING EXTENSION PATTERNS 51 AND 53 |
| C | REINFORCE-MENT GEOMETRY | GEOMETRY WHICH IS ACTUALLY PRESENT AFTER MANUFACTURING | NEEDED | WIRING REINFORCE-MENT PATTERN 62 |
| D | YIELD GEOMETRY | GEOMETRY WHICH IS ACTUALLY PRESENT AFTER MANUFACTURING | NEEDED | YIELD ENHANCEMENT PATTERN WIRING PATTERN 72 |

FIG. 5

| ADJACENT DISTANCE (d) | ADDITIONAL GEOMETRY | DISCRIMINATION OF GRAPHIC |
|---|---|---|
| d < D1 | W1 | NECESSARY FOR MANUFACTURING |
| D1 < d < D2 | W1 + W2 | NECESSARY FOR MANUFACTURING<br>NECESSARY FOR MANUFACTURING |
| D2 < d < D3 | W1 + W2 + W3 | NECESSARY FOR MANUFACTURING<br>NECESSARY FOR MANUFACTURING<br>FOR YIELD ENHANCEMENT |
| D3 < d | W1 + W2 + W3 + W4 | NECESSARY FOR MANUFACTURING<br>NECESSARY FOR MANUFACTURING<br>FOR YIELD ENHANCEMENT<br>FOR YIELD ENHANCEMENT |

FIG. 6

24 ~ 27: BASIC GEOMETRY
W1 ~ W4: ADDITIONAL GEOMETRY

44: YIELD-ENHANCEMENT REDUNDANT VIA
45: REDUNDANT VIA

FIG. 12

| CLASSIFI-CATION | CLASS OF GEOMETRY | CHARACTERISTIC OF GEOMETRY | CIRCUIT EXTRACTION | GEOMETRY LIST |
|---|---|---|---|---|
| A | BASIC GEOMETRY | GEOMETRY WHICH IS ACTUALLY PRESENT AFTER MANUFACTURING | NEEDED | WIRING PATTERNS 21 TO 23, REDUNDANT VIAS 45 |
| B | EXTENSION GEOMETRY | GEOMETRY WHICH IS NOT ACTUALLY PRESENT AFTER MANUFACTURING | NOT NEEDED | WIRING EXTENSION PATTERNS 51 AND 53 |
| C | REINFORCE-MENT GEOMETRY | GEOMETRY WHICH IS ACTUALLY PRESENT AFTER MANUFACTURING | NEEDED | WIRING REINFORCE-MENT PATTERN 62 |
| D | YIELD GEOMETRY | GEOMETRY WHICH IS ACTUALLY PRESENT AFTER MANUFACTURING | NEEDED | YIELD ENHANCEMENT PATTERN WIRING PATTERN 72, YIELD-ENHANCEMENT REDUNDANT VIA 44 |

FIG. 13

AUTOMATIC DESIGN DEVICE, METHOD, AND PROGRAM FOR SEMICONDUCTOR INTEGRATED CIRCUITS

CROSS-REFERENCE TO RELATED APPLICATIONS

This application is based on and claims the benefit of priority from the prior Japanese Patent Application No.2005-366635, filed on Dec. 20, 2005; the entire contents of which are incorporated herein by reference.

TECHNICAL FIELD

The present invention relates to an automatic design device, an automatic design-method, and an automatic design program for semiconductor integrated circuits.

BACKGROUND

In design of semiconductor integrated circuits, cells or blocks having a logic function or memory function are arranged in a chip, and input and output terminals are wired. Then, a layout on a chip region is determined so as to obtain a desired circuit operation. An automatic design device automatically optimizes the cell placement and the wiring between terminals so as to determine the entire layout of chip region.

Meanwhile, as the miniaturization of semiconductor integrated circuits proceeds, it is increasingly difficult to manufacture a target geometric shape having electric performance, which is intended in design by a designer, on a substrate. In order to manufacture a target geometric shape on a substrate, optical correction processing using mask data processing (MDP) and optical proximity correction (OPC) is performed on basic geometry such as wiring lines and the like, which are arranged on a chip region, and various geometry necessary from a request in manufacturing are added (for example, refer to JP-A-10-153851). Further, analysis or correction processing of circuit characteristics is also performed on the basic geometry to which various geometries are added, and various geometry necessary from a request for circuit characteristics are also added.

In an automatic design device which is currently and generally used, however, graphic processing in which various geometry are added to basic geometry is executed in different processes from each other by various design tools. Therefore, it is impossible to clearly discriminate whether the geometry are added from a request in manufacture or from a request for circuit characteristics. As a result, the information of additional geometries added from a request in manufacture, which are not actually formed on a substrate, is analyzed as a target of circuit analysis, thereby degrading extraction precision of circuit characteristics. Further, since the types of added geometry cannot be discriminated, it is difficult to perform optimal design which satisfies both a request in manufacture and a request for circuit characteristics. Therefore, design efficiency and design precision are also degraded.

SUMMARY

According to an aspect of the invention, an automatic design device includes; a calculating section that calculates a plurality of additional geometries added to a plurality of basic geometries including wiring lines and vias arranged on a chip region and stores the calculation result in a wiring storage section; a classifying section that reads the calculation result on the plurality of additional geometries from the wiring storage section, classifies the plurality of additional geometries into at least additional geometries required for manufacture and additional geometries required for circuit characteristics in accordance with the division and characteristics of the plurality of additional geometries in order to manufacture the basic geometries on the chip region, and stores the classification result into a classification storage section; and an analyzing section that extracts at least some of the plurality of additional geometries through the classification result in accordance with the purpose of analysis and analyzes characteristics of the basic geometries.

According to another aspect of the invention, an automatic design method includes: allowing a calculating section to calculate a plurality of additional geometries added to a plurality of basic geometries including wiring lines and vias arranged on a chip region and store the calculation result in a wiring storage section; allowing a classifying section to read the calculation result on the plurality of additional geometries from the wiring storage section, classifying the plurality of additional geometries into at least additional geometries required for manufacture and additional geometries required for circuit characteristics in accordance with the division and characteristics of the plurality of additional geometries in order to manufacture the basic geometries on the chip region, and store the classification result into a classification storage section; and allowing an analyzing section to extract. at least some of the plurality of additional geometries through the classification result in accordance with the purpose of analysis and analyze characteristics of the basic geometries.

According to still another aspect of the invention, an automatic design program which makes a computer to execute: allowing a calculating section to calculate a plurality of additional geometries added to a plurality of basic geometries including wiring lines and vias arranged on a chip region and store the calculation result in a wiring storage section; allowing a classifying section to read the calculation result on the plurality of additional geometries from the wiring storage section, classifying the plurality of additional geometries into at least additional geometries required for manufacture and additional geometries required for circuit characteristics in accordance with the division and characteristics of the plurality of additional geometries in order to manufacture the basic geometries on the chip region, and store the classification result into a classification storage section; and allowing an analyzing section to extract at least some of the plurality of additional geometries through the classification result in accordance with the purpose of analysis and analyze characteristics of the basic geometries.

DESCRIPTION OF THE EMBODIMENTS

Referring to accompanying drawings, preferred embodiments of the invention will be described. In the drawings, like reference numerals will be attached to the same components. However, since the drawings are schematically shown, it should be considered that the relationship between thickness and plane dimension, a thickness ratio between respective layers, and the like differ in practice. Therefore, a specific thickness or dimension should be determined by referring to the following descriptions. Further, it is natural that the relationships or ratios between dimensions in the respective drawings are different from each other. Further, in the following embodiments, a device and method for embodying technical ideas of the invention are exemplified, but the technical ideas do not limit the material, the shape, the structure, and the disposition of constituent parts to those of the following parts. In the technical ideas of the invention, various modifications can be made in the range of claims.

First Embodiment

Figure 1:
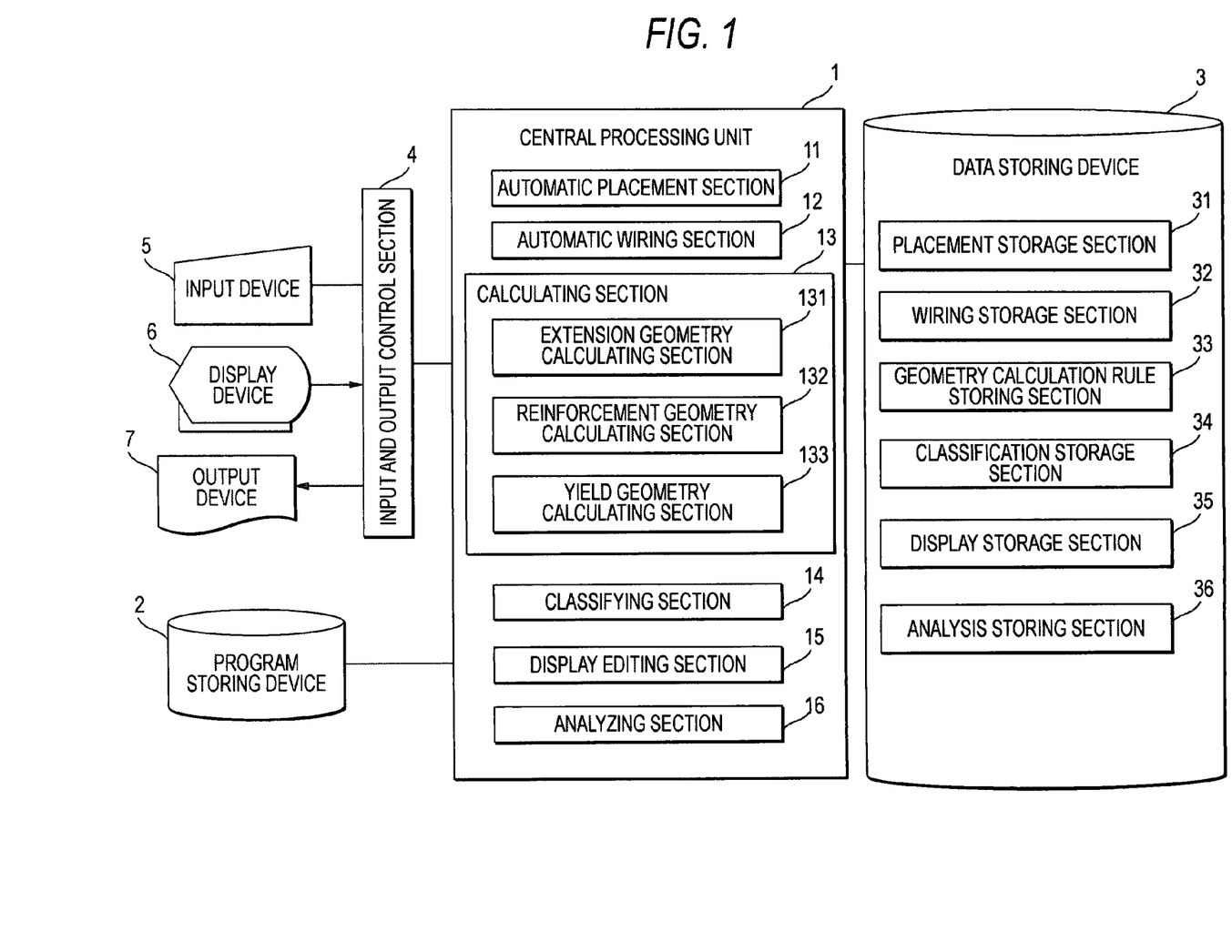
FIG. 1 is an exemplary block diagram illustrating an automatic design device according to a first embodiment of the invention.

As shown in FIG. 1, an automatic design device according to a first embodiment of the invention includes a calculating section 13, a classifying section 14, and an analyzing section 16. The calculating section 13 calculates a plurality of additional geometries added to a plurality of basic geometries including wiring lines and vias arranged on a chip region and stores the calculation result in a wiring storage section 32. The classifying section 14 reads the calculation result on the plurality of additional geometries from the wiring storage section 32, classifies the plurality of additional geometries into at least additional geometries required for manufacture and additional geometries required for circuit characteristics in accordance with the division and characteristics of the additional geometries in order to manufacture basic geometries on a chip region, and stores the classification result in a classification storing section 34. Using the classification result, the analyzing section 16 extracts at least some of the plurality of additional geometries in accordance with the purpose of analysis and analyzes characteristics of the basic geometries.

The calculating section 13, the classifying section 14, and the analyzing section 16 can be constructed as a portion of a central processing unit (CPU) 1 of a computer system The CPU 1 is connected to an input device 5, a display device 6, an output device 7, and a program storing device 2, respectively. The input device 5 accepts an input from an operator. The display device 6 displays processing results of the CPU 1 and the layout result of a chip. The program storing device 2 stores various programs required for arithmetic processing of the CPU 1.

Figure 2:
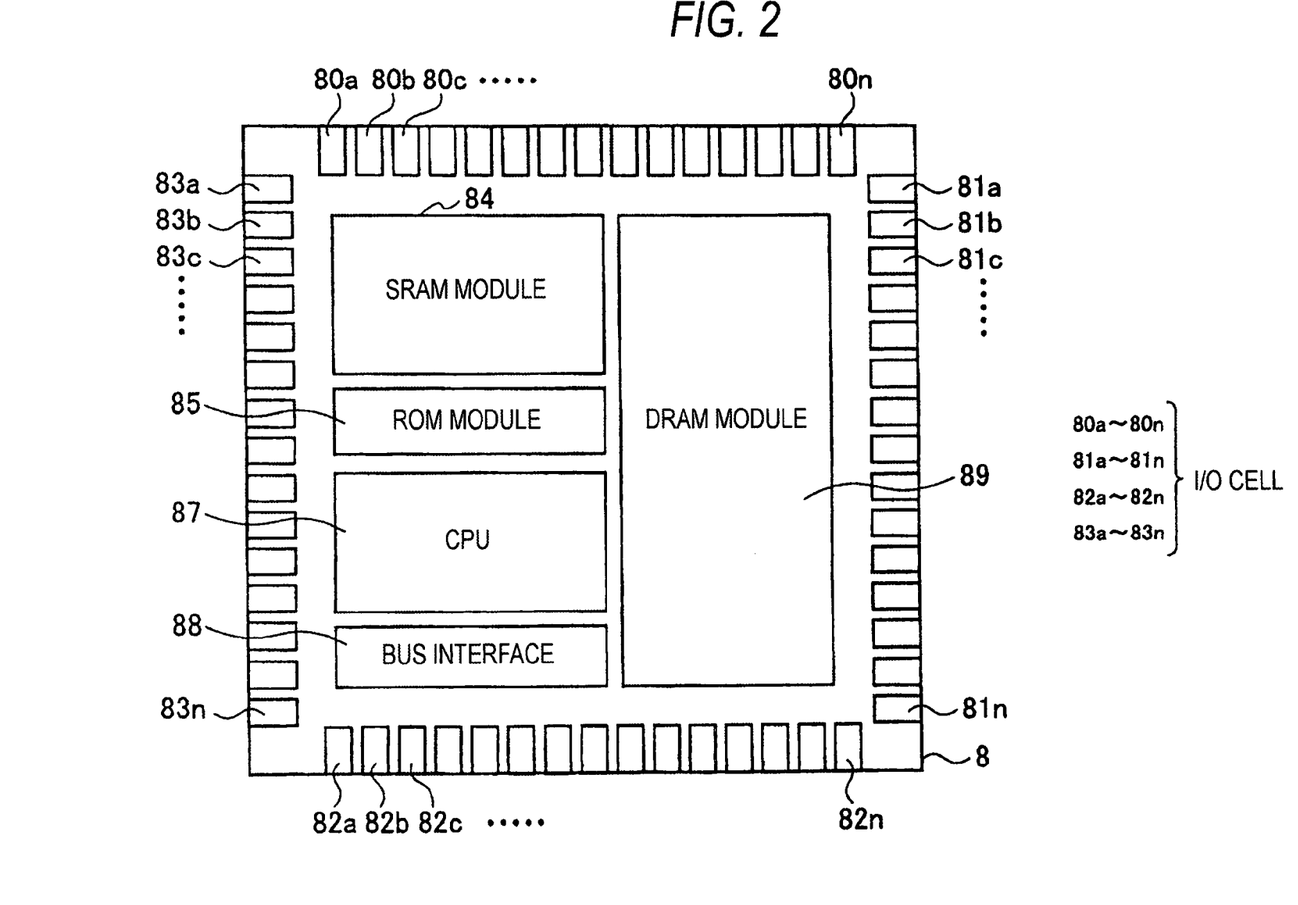
FIG. 2 is an example of a layout result performed by the automatic design device according the first embodiment.

The CPU 1 further includes an automatic placement section 11, an automatic wiring section 12, and a display editing section 15. As shown in FIG. 2, the automatic placement-section 11 reads a program input through-the input device 5 so as to arrange I/O cells 81a to 81n, 82a to 82n, 83a to 83n, and 84a to 84n and macro cells (FIG. 2 illustrates an SRAM module 84, a ROM module 85, a CPU 87, a bus interface 88, and a DRAM module 89) in a chip region 8 which is set within a memory space of the automatic design device. The automatic wiring section 12 refers to the program input through the input device 5 so as to lay multilayer wiring lines inside the chip region 8 and to connect wiring lines between different layers through a via. The calculating section 13 includes an extension geometry calculating section 131, a reinforcement geometry calculating section 132, and a yield geometry calculating section 133.

Figure 3:
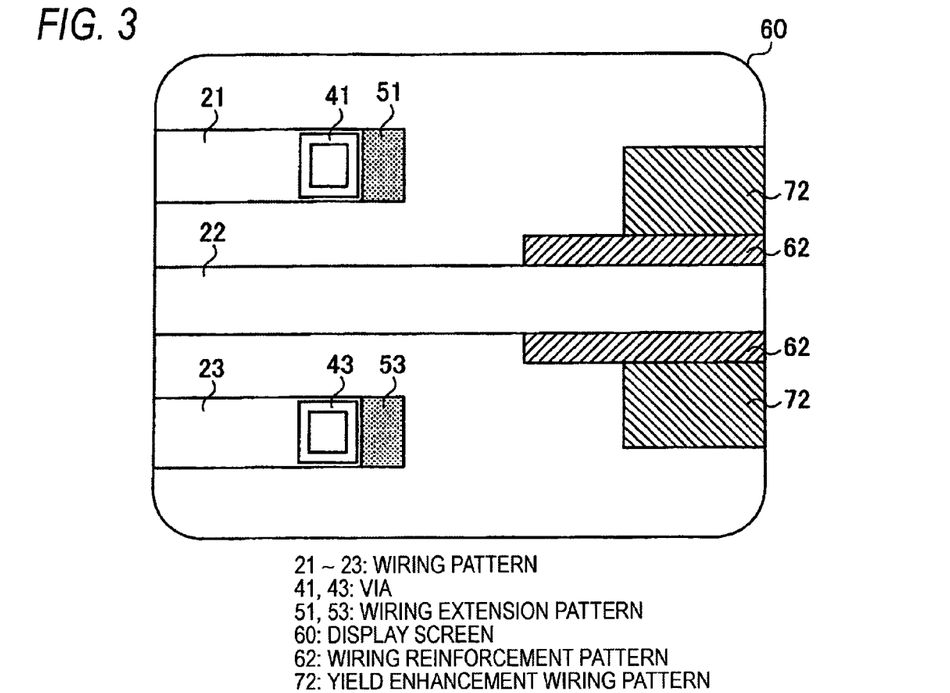
FIG. 3 is an example of a layout result performed by the automatic design device according the first embodiment.

FIG. 3 illustrates a display screen 60 of the display device 6 of FIG. 1, showing a condition where wiring information displayed on the display screen 60 is displayed. As one example, a plurality of wiring patterns 21, 22, and 23 are arranged in parallel so as to be spaced from each other on the display screen 60. On the wiring pattern 21, a via 41 is disposed. In order to extend the line end of the wiring pattern 21, a wiring extension pattern 51 is added. In order to extend the line width of the wiring pattern 22, a wiring reinforcement pattern 62 is added to the wiring pattern 22. In order to further extend the line width of the wiring pattern 22, a yield enhancement wiring pattern 72 coming in contact with the wiring reinforcement pattern 62 is formed. On the wiring pattern 23, a via 43 is disposed. In order to extend the line end of the wiring pattern 23, a wiring extension pattern 53 is added.

The extension geometry calculating section 131 of FIG. 1 reads an placement result of the automatic wiring section 12 and a graphic calculation rule stored in the data storing device 3 and calculates geometric information of the wiring extension patterns 51 and 53 for extending the line ends of the wiring patterns 21 and 23 of FIG. 3. The reinforcement geometry calculating section 132 reads an placement result of the automatic wiring section 12 and a graphic calculation rule stored in the data storing device 3 and calculates geometric information of the wiring reinforcement pattern 62 added to the wiring pattern 22 of FIG. 3. The yield geometry calculating section 133 reads an placement result of the automatic wiring section 12 and a graphic calculation rule stored in the data storing device 3 and calculates geometric information of the yield enhancement wiring pattern 72 added to the wiring pattern 22.

Figure 4:
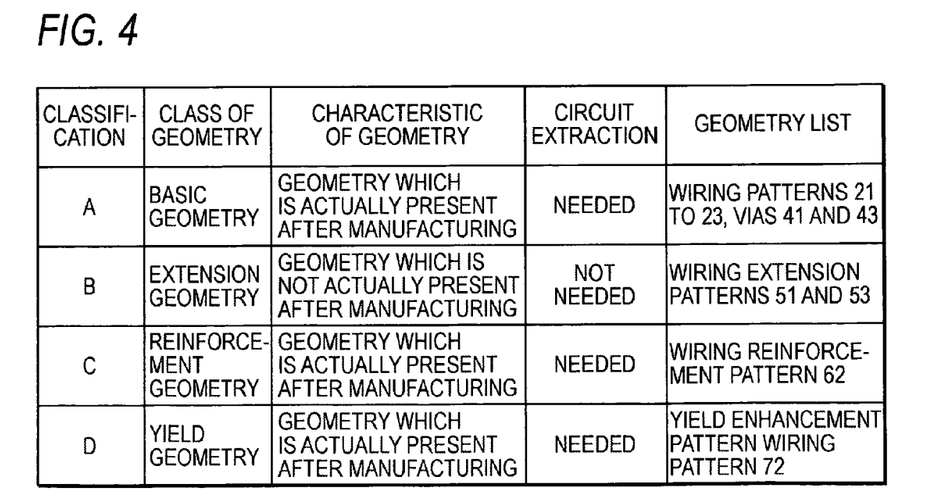
FIG. 4 is an exemplary table showing an example of classification result of various geometric information performed by the automatic design device according the first embodiment.

The classifying section 14 classifies the additional geometric information calculated by the extension geometry calculating section 131, the reinforcement geometry calculating section 132, and the yield geometry calculating section 133, in accordance with the types and characteristics of the geometries. For example, information of the wiring patterns 21 to 23 and the vias 41 and 43 shown in FIG. 3 is geometric information which the automatic wiring section 12 creates by referring to a floor plan or the like and which is the base in design. Therefore, the classifying section 14 classifies graphic types of the wiring patterns 21 to 23 and the vias 41 and 43 into a group A as 'basic graphic' as shown in FIG. 4. The basic graphic is required to be actually present on a chip region of a semiconductor substrate even after a semiconductor integrated circuit is manufactured. Further, the basic graphic is geometric information which becomes a target of circuit extraction. Therefore, the classifying section 14 defines graphic characteristics of the group A as 'graphic actually present after manufacture' and 'graphic needed for circuit extraction'.

The wiring extension patterns 51 and 53 of FIG. 3 are calculated by the extension geometry calculating section 131 and different types of geometries from 'the basic graphic' classified into the group A. Therefore, the classifying section 14 classifies graphic types of the wiring extension patterns 51 and 53 into a group B as 'extension graphic'. The extension graphic is geometric information added from a request in manufacture of the wiring pattern 21 and is not reproduced on a chip region of an actual semiconductor substrate because it is influenced by the diffraction of exposure light or the like. Therefore, the classifying section 14 defines graphic characteristics of the group B as 'graphic which is not actually present after manufacture' and 'graphic not needed for circuit extraction'.

The wiring reinforcement pattern 62 of FIG. 3 is calculated by the reinforcement geometry calculating section 132 and is a different type of graphic from 'basic graphic' and 'extension graphic' classified into the group A and the group B, respectively. The classifying section 14 classifies a graphic type of the wiring reinforcement pattern 62 into a group C as 'reinforcement graphic'. The reinforcement graphic is geometric information added from a request in manufacture of the wiring pattern 22. However, the reinforcement graphic is required to be implemented on a chip region of an actual semiconductor substrate and is geometric information which is a target of circuit extraction. Therefore, the classifying section 14 classifies graphic characteristics of the group,C as 'graphic actually present after manufacture' and 'graphic needed for circuit extraction'.

The yield enhancement wiring pattern 72 of FIG. 3 is a different type of geometric information from 'basic graphic', 'extension graphic', and 'reinforcement graphic' calculated by the yield geometry calculating section 133 and classified into the groups A to C, respectively. The classifying section 14 classifies a graphic type of the yield enhancement wiring pattern 72 into a group D as 'yield graphic'. The yield graphic is added from a request for yield enhancement of the wiring pattern 22. Further, the yield graphic is required to be implemented on an actual substrate and is geometric information which is a target of circuit extraction. The classifying section 14 defines graphic characteristics of the group D as 'graphic actually present after manufacture' and 'graphic needed for circuit extraction'.

The display editing section 15 extracts the classification result of the classifying section 14 and displays the result on the display screen 60 shown in FIG. 3. In this case, the display editing section 15 displays the result by using different colors such that the division and characteristics of the respective patterns can be clearly discriminated. For example, on the display screen 60 shown in FIG. 3, the wiring patterns 21 to 23, the vias 41 and 43, the wiring extension patterns 51 and 53, the wiring reinforcement pattern 62, and the yield enhancement wiring pattern 72 are displayed with different colors depending on the classified groups A to D.

The analyzing section 16 refers to the classification result of the classifying section 14 so as to analyze circuit characteristics within the chip region 8 and corrects the layout information calculated by the automatic wiring section 12, the calculating section 13 and the like. For example, among the respective patterns shown in FIG. 3, only the wiring extension patterns 51 and 53 classified into the group B are not present on a chip region of a semiconductor substrate after manufacture and are geometries which are not a target of circuit extraction. Therefore, the analyzing section 16 performs timing analysis by referring to the information of the groups A, B, and D except for the wiring reinforcement patterns 51 and 53 and performs correction, if necessary.

The data storing device 3 of FIG. 1 includes a placement storage section 31, a wiring storage section 32, a geometry calculation rule storing section 33, a classification storage section 34, a display storage section 35, and an analysis storing section. The placement storage section 31 stores constraint information on automatic placement, such as netlist and timing constraints. The wiring storage section 32 stores constraint information on automatic wiring, such as wiring rule information, via connection information, and the like. The geometry calculation rule storing section 33 stores an extension graphic calculation rule for calculating the wiring extension patterns 51 and 53 and a target mask data processing calculation rule shown in FIGS. 5 and 6.

The target mask data processing calculation rule indicates such a rule that is used in processing for enhancing productivity by using the following method. Based on the density of each pattern, a specific pattern (target pattern), which is difficult to actually manufacture on a semiconductor substrate after automatic design, is selectively extracted, and an additional graphic is added to the extracted pattern. Such a rule allows an additional graphic to be added to a pattern which is present in a region where wiring lines are coarsely arranged, the additional graphic being larger than a pattern which is present in a region where wiring lines are densely arranged. Accordingly, regardless of the density of pattern, it is possible to manufacture a pattern having a desired shape. Further, in a conventional design device, the target mask data processing is executed in mask data processing after automatic placement wiring processing is completed.

An example of the target mask data processing calculation rule which can be used in the design device of FIG. 1 will be described. For example, in a target mask data processing calculation rule table of FIG. 5, size information and graphic characteristics (graphic division) of additional geometries W1 to W4 are shown. The additional geometries W1 to W4 are added so as to correspond to the relationship among distances D1 to D3 (D1<D2<D3) which are previously set on the basis of the adjacent distance d between patterns, which are automatically arranged by the automatic design device, and a design rule of a semiconductor integrated circuit. In FIG. 6, the additional geometries W1 is attached on the edge of the basic geometry 24 facing the edge of the basic geometry 25. The additional geometries W1 and W2 are attached on the edge of the basic geometry 24 facing the edge of the basic geometry 26. The additional geometries W1 to W4 are attached on the edge of the basic geometry 24 facing the edge of the basic geometry 27.

The classification storage section 34 of FIG. 1 stores a classification result of geometries classified by the classifying section 14. The display storage section 35 stores a display result of the display device 6. The analysis storing section 36 stores an analysis result of layout analyzed by the analyzing section 16. The program storing device 2 stores input/output data, layout parameters, a history thereof, and data which is being calculated. The input device 5 includes a keyboard, a mouse, a light pen, a flexible disk device or the like. An operator can designate input/output data or set numerical values required for automatic design by using the input device 5. The display device 6 and the output device 7, respectively, include a display, a printer and the like.

Next, an automatic design method for semiconductor integrated circuits using the automatic design device shown in FIG. 1 will be described with reference to flow charts shown in FIGS. 7 and 8.

(A) In a front-end design process of step S10, the circuit operation of a semiconductor integrated circuit to be designed is described by such a language as RTL (Register Transfer Level) or the like. Based on the described circuit operation, logic design of basic block such as a gate is performed, and a netlist of semiconductor integrated circuits is determined.

(B) In a back-end design process of step S20, the layout of the semiconductor integrated circuit is determined on the basis of the design result executed in the step S10. That is, in step S21, the floor plan of a chip region is created on the basis of various design information such as the netlist determined in the step S10. The created floor plan is stored in the data storing device 3 through the input device 5. In step S22, the information on the floor pan stored in the data storing device 3 is read so that logic synthesis is carried out.

(C) In step S23, the automatic placement section 11 of FIG. 1 reads the floor plan and design constraint information, stored in the data storing device 3, so as to arrange the I/O cells 81a to 81n, 82a to 82n, 83a to 83n, and 84a to 84n and the macro-cells (the SRAM module 84, the ROM modules 85, the CPU 87, the bus interface 88, and the DRAM module 89) within the chip region 8, as shown in FIG. 2. The placement result is stored in the placement storage section 31. The automatic wiring section 12 reads the floor plan and design constraint information stored in the data storing device 3 and wires the wiring patterns 21, 22, and 23 within the chip region such that the wiring patterns 21, 22, and 23 are connected through the vias 41 and 43, as shown in FIG. 3. The wiring result is stored in the wiring storage section 32.

(D) In step S24, the calculating section 13 reads the wiring result stored in the wiring storage section 32 and the graphic calculation rule stored in the geometry calculation rule storing section 33 and calculates additional geometric information including the wiring extension patterns 51 and 53, the wiring reinforcement pattern 62, and the yield enhancement wiring pattern 72 which are arranged in the chip region, as shown in FIG. 3. The details of the step S24 will be described below. The calculation result of additional geometric information is stored in the wiring storage section 32.

(E) In step S25, the classifying section 14 reads the additional geometric information, such as the wiring patterns 21 to 23, the vias 41 and 42, the wiring extension patterns 51 and 52, the wiring reinforcement pattern 62, and the yield enhancement wiring pattern 72, the additional geometric information being stored in the wiring storage section 32. Further, the classifying section 14 classifies the additional geometric information in accordance with the types and characteristics thereof, as shown in FIG. 4. The classification result is stored in the classification storage section 34.

(F) In step S26, the display editing section 15 reads the classification result stored in the classification storage section. The display editing section 15 displays the wiring patterns 21, 22, and 23, the vias 41 and 43, the wiring extension patterns 51 and 53, the wiring reinforcement pattern 62, and the yield enhancement wiring pattern 72 in accordance with the groups A to D shown in FIG. 4. In this case, the display editing section 15 displays the respective patterns by using different colors such that the division and characteristics thereof can be clearly discriminated on the display screen 60 shown in FIG. 3. The display result is stored in the display storage section 35.

(G) In step S27, the analyzing section 16 reads the wiring result stored in the wiring storage section 32 and the classification result stored in the classification storage section. For example, the wiring extension patterns 51 and 53 classified into the group B among the respective patterns shown in FIG. 3 are geometries which are not present on a chip region of a semiconductor substrate after manufacture. Therefore, the analyzing section 16 performs timing analysis by referring to only the information of the groups A, B, and D except for the information of the wiring extension patterns 51 and 53 and performs correction if necessary. The analysis result is stored in the analysis storing section 36. After that, mask data processing is executed in step S30, based on the analysis result stored in the analysis storing section 36.

An example of the additional geometric calculation processing described in the step S24 of FIG. 7 will be described with reference to a flow chart shown in FIG. 8.

(A) In step S240, the extension geometry calculating section 131 reads the wiring result stored in the wiring storage section 32. The extension geometry calculating section 131 refers to the extension graphic calculation rule stored in the geometry calculation rule storing section 33 so as to calculate geometric information of the wiring extension patterns 51 and 53 added to the line ends of the wiring patterns 21 and 23, respectively, as shown in FIG. 3. The calculation result on the wiring extension patterns 51 and 53 is stored in the wiring storage section 32. Further, the wiring extension patterns 51 and 53 may be calculated during the automatic placement wiring process by using various rules which are used in the automatic placement & wiring process of the step S23 of FIG. 7.

Figure 5:
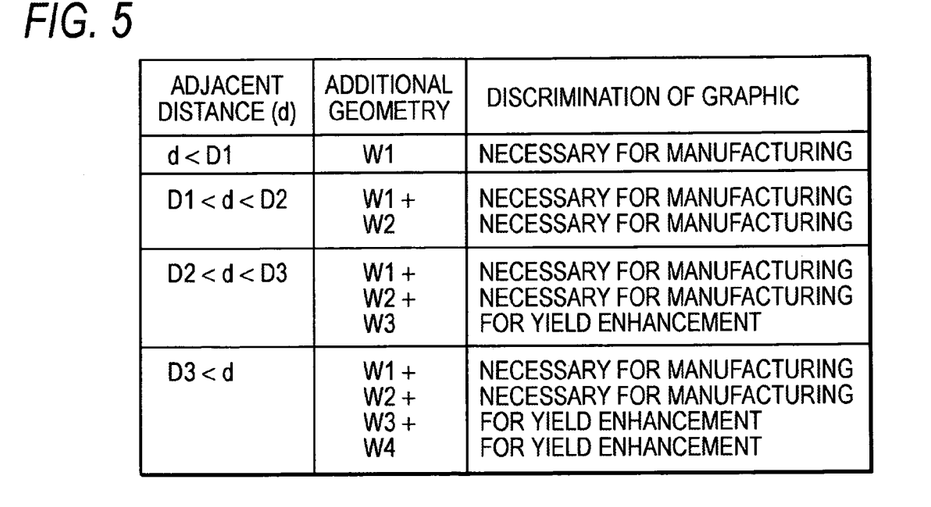
FIG. 5 is an exemplary table showing a graphic calculation rule (target mask data processing calculation rule) of the automatic design device according the first embodiment.
Figure 6:
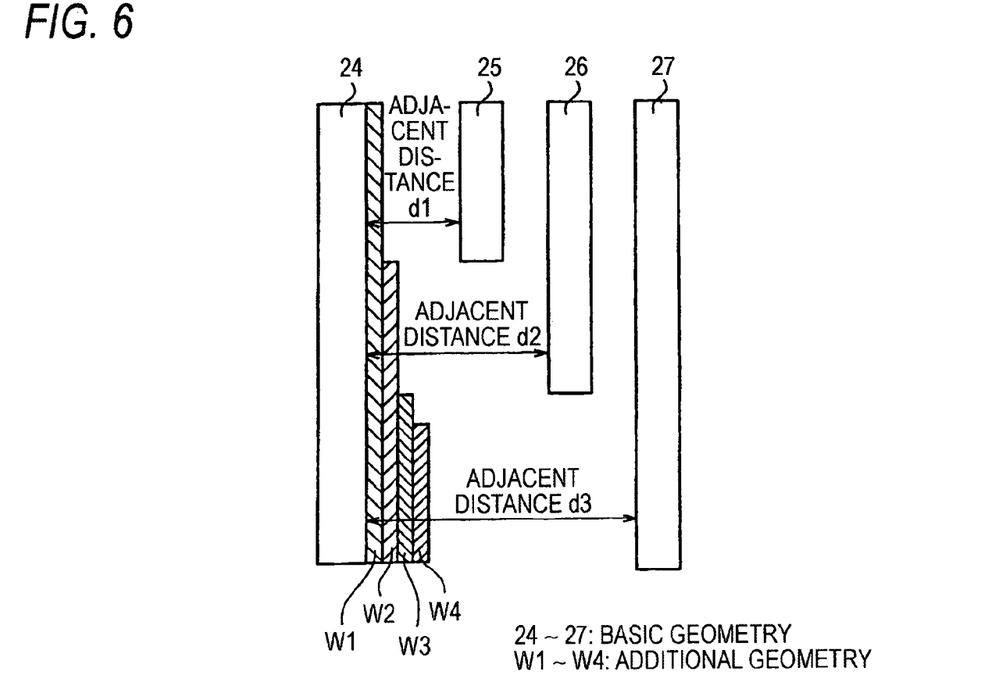
FIG. 6 is an exemplary diagram for explaining a graphic calculation rule (target mask data processing calculation rule) of the automatic design device according the first embodiment.

(B) In step S241, the reinforcement geometry calculating section 132 reads out the wiring result stored in the wiring storage section 32 and the target mask data processing calculation rule stored in the geometry calculation rule storing section 33, as shown in FIGS. 5 and 6. For example, the reinforcement geometry calculating section 132 extracts the relationships between the adjacent distance d3 between the basic geometries 24 and 27 and the distances D1 to D3 which are previously set in FIG. 5, as shown in FIG. 6. Here, it is assumed that the adjacent distance d3 is larger than the distance D3 (D3<d3). The reinforcement geometry calculating section 132 calculates the additional geometries W1 ,and W2, which are necessary for manufacture, with respect to the basic geometry 24. Further, the reinforcement geometry calculating section 132 widens the line width of the basic geometry 24. As a result, the wiring reinforcement pattern 62 shown in FIG. 3 is calculated, which extends the line width of the wiring pattern 22. The calculating result of the wiring reinforcement pattern 62 is stored in the wiring storage section 32.

(C) In step S242, the yield geometry calculating section 133 reads the wiring result stored in the wiring storage section 32 and the target mask data processing calculation rule stored in the geometry calculation rule storing section 33 so as to calculate the additional geometry W3 for improving a yield with respect to the basic geometry 24 and widens the line width of the basic geometry 24 one-stage further. After that, yield analysis is performed on the geometric information of the basic geometry 24 and the additional geometries W1 to W3 in step S243, and timing analysis is performed in step S244. It is judged in step S245 whether the yield analysis and the timing analysis satisfy a predetermined condition or not. If the condition is satisfied, the process proceeds to the step S242.

(D) In the step S242, the yield geometry calculating section 133 further adds the additional geometry W4 to the basic geometry 24 so as to thicken the line width one-stage further. After that, in the steps S243 and S244, the yield analysis and the timing analysis are performed once again. In the step S245, it is judged whether the yield analysis and the timing analysis satisfy a predetermined condition or not. If the condition is satisfied, the process again proceeds to the step S242. If the condition is not satisfied, the process proceeds to the step S246, and the additional geometry W4 added in the step S242 is removed so that the line width of the basic geometry 24 returns to the previous state. Accordingly, the yield enhancement wiring pattern 72 shown in FIG. 3 is calculated. The calculation result of the yield enhancement wiring pattern 72 is stored in the wiring storage section 32.

Figure 9:
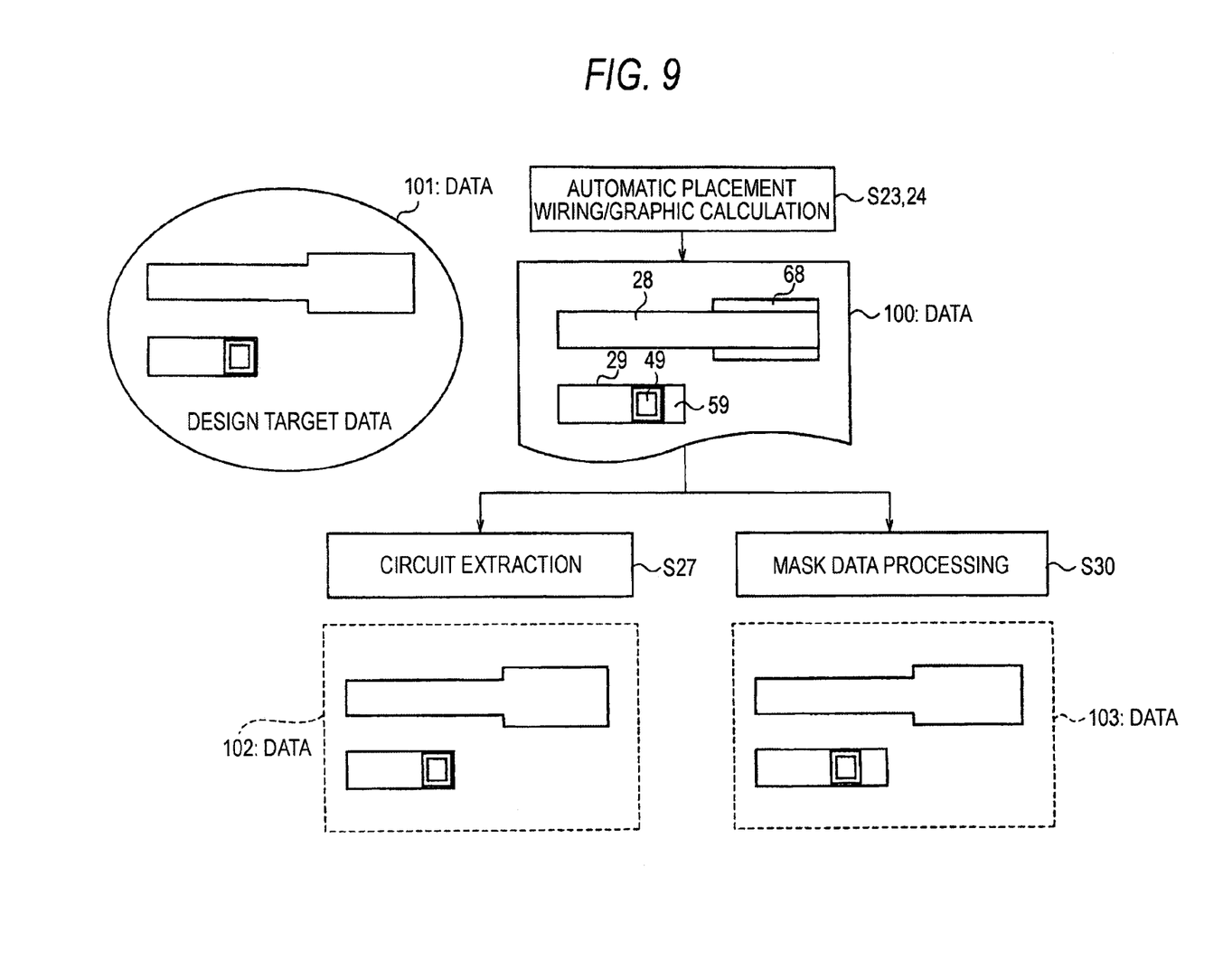
FIG. 9 is an exemplary diagram for explaining data examples which are used in the automatic design method according to the first embodiment.

According to the automatic design method of the first embodiment, data 100 is created in the automatic placement & wiring/graphic calculation process shown in the steps S23 and S24, as shown in FIG. 9. In the data 100, wiring patterns 28 and 29 are disposed so as to be spaced from each other, and a via 49 is disposed on the wiring pattern 29. In order to extend the line end of the wiring pattern 29, a wiring reinforcement pattern 59 is disposed. Further, in order to extend the line width of the wiring pattern 28, a wiring reinforcement pattern 68 is disposed. Moreover, it is assumed that design target data to be manufactured on a semiconductor substrate is such geometric information as shown in data 101.

The classifying section 14 classifies the types and characteristics of geometries of the respective patterns of the data 100 and stores the classification result in the classification storage section 34. Therefore, when circuit extraction is performed in step S27, calculation can be performed by using data 102 which does not include information of the wiring reinforcement pattern 59 which is not actually manufactured on a substrate. Accordingly, analysis based on the shape of pattern which is actually manufactured on a substrate can be performed, thereby enhancing circuit extraction precision. Meanwhile, when mask data processing 30 is executed in the step S30, data 103 including all the geometric information added from a request in manufacture is used on the basis of the classification result of the classifying section 14. Therefore, it is possible to provide an automatic design method in which design precision and design efficiency can be enhanced.

The display editing section 15 displays the wiring result on the display screen 60 of FIG. 3 by using different colors such that the respective pattern shapes and characteristics are clearly discriminated. Therefore, a designer can clearly discriminate whether the additional geometric information is added from a request in manufacture or from a request for circuit characteristics. Since a designer can manually performs analysis or correction by using the additional geometric information displayed on the display screen 60, it is possible to perform optimal design which satisfies both request in manufacture and request for circuit characteristics. Further, in the automatic design device according to the first embodiment, the target mask data processing, which is generally executed in the mask data processing of the step S30, is performed in the automatic placement & wiring process of the steps S23 and S24. Therefore, a degree of freedom of correction increases more than when target mask data processing is performed on the mask data to which the additional geometries have already been added in the step S30. Therefore, design efficiency is enhanced.

Figure 7:
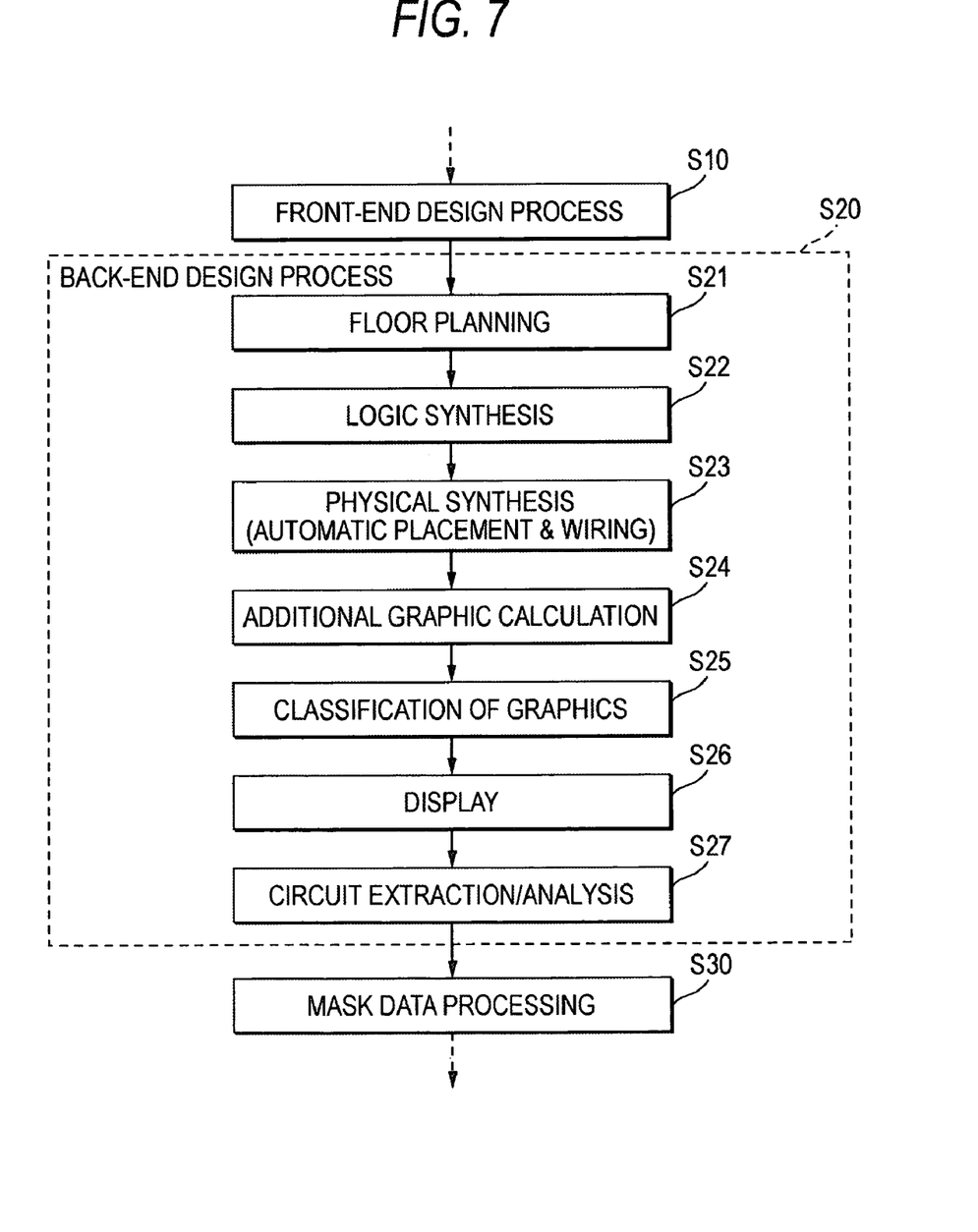
FIG. 7 is an exemplary flow chart showing an automatic design method according to the first embodiment.
Figure 8:
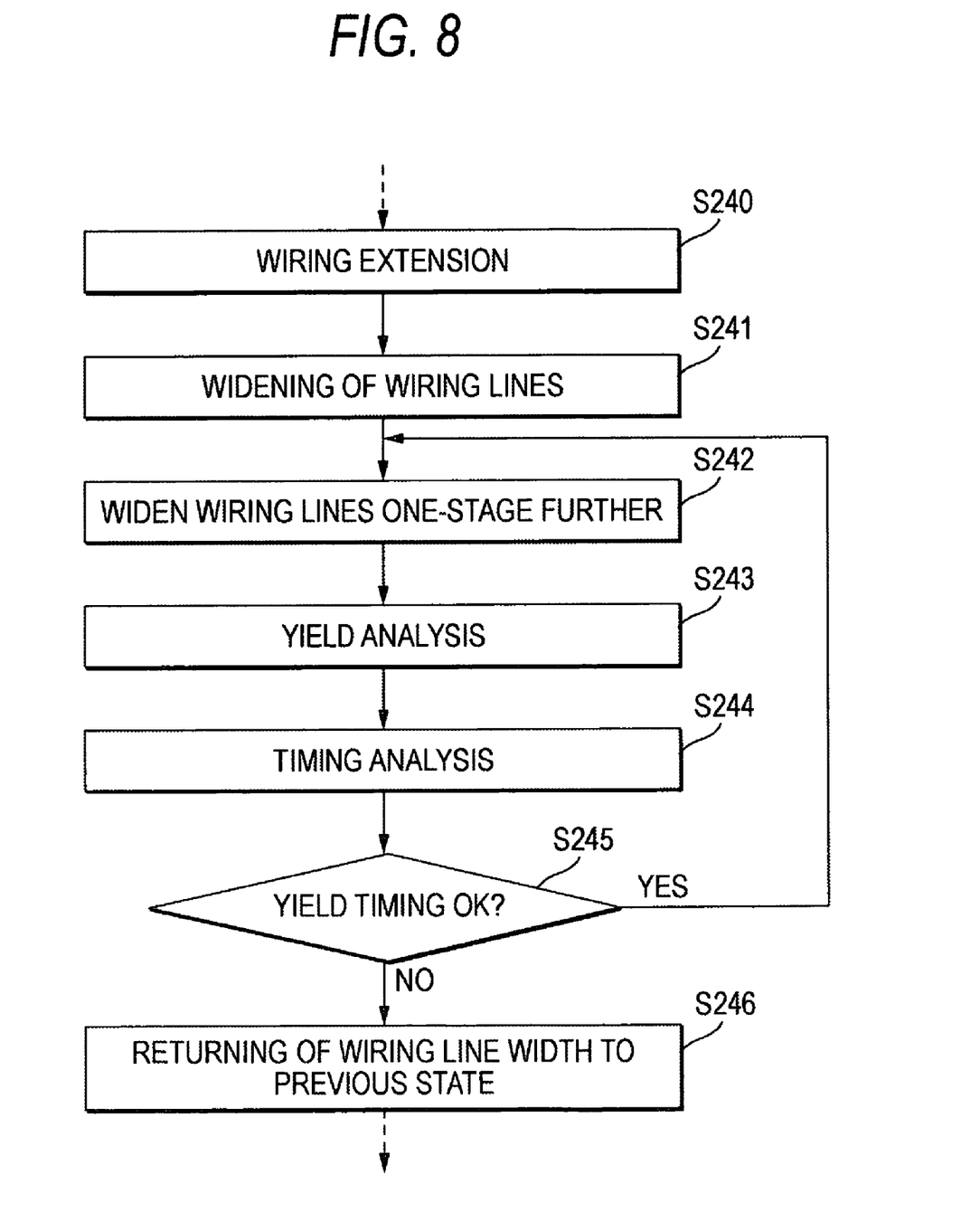
FIG. 8 is a exemplary flow chart showing an example of an additional graphic calculation method of the automatic design method according to the first embodiment.

The series of design processing showing the flow shown in FIGS. 7 and 8 can be executed through a program of algorithm equivalent to FIGS. 7 and 8 by controlling the automatic design device shown in FIG. 1. The program may be stored in the program storing device 2 shown in FIG. 1.

Second Embodiment

Figure 10:
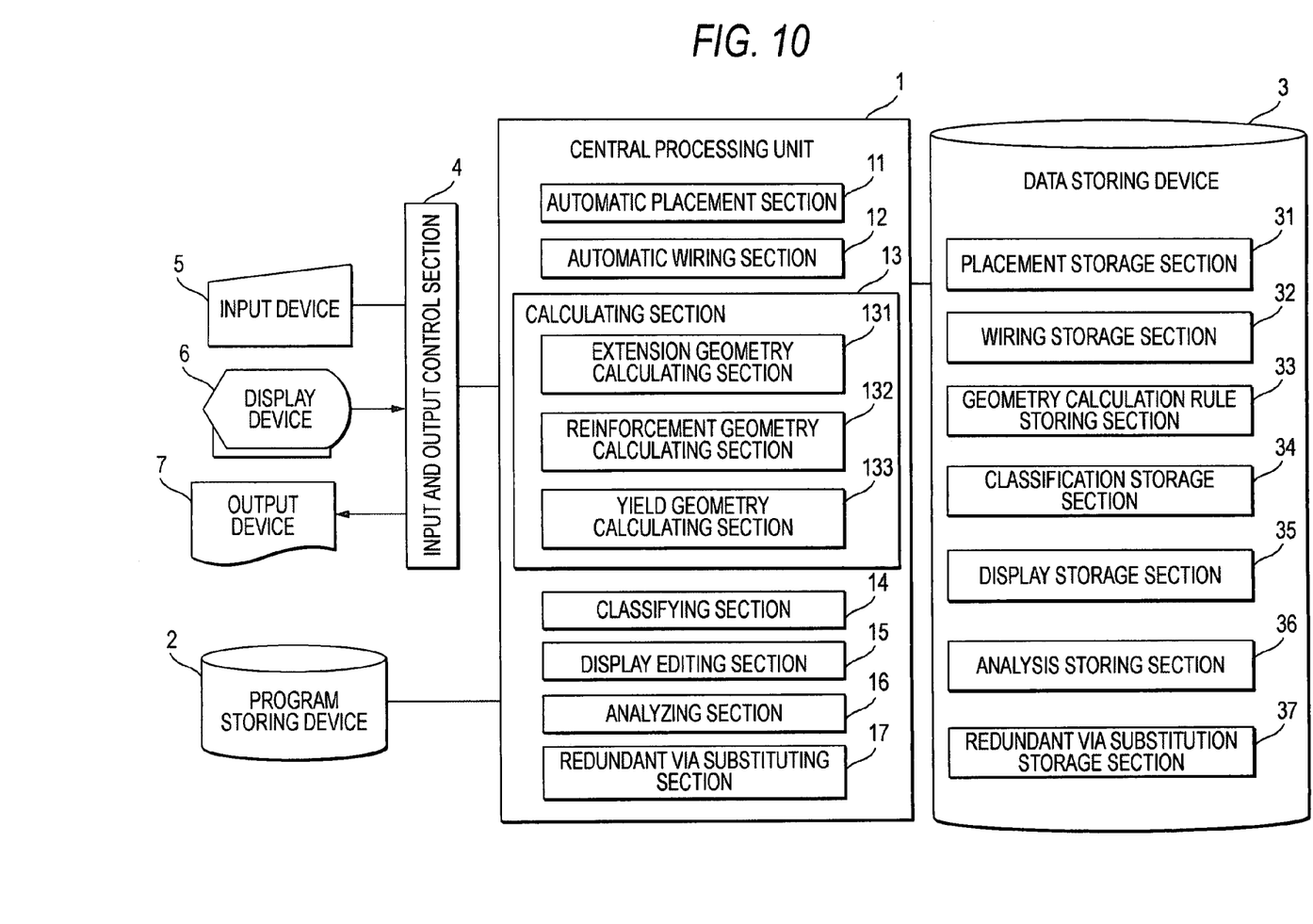
FIG. 10 is an exemplary block diagram illustrating an automatic design device according to a second embodiment of the invention.

As shown in FIG. 10, an automatic design device according to a second embodiment is different from that shown in FIG. 1 in that the automatic design device further includes a redundant via substituting section 17 and a redundant via substitution storage section 37. Here, 'redundant via' in the second embodiment indicates a plurality of vias which are arranged adjacent to the connection portion between upper and lower wiring layers. The redundant via substituting section 17 substitutes vias (single-cut vias) on the wiring patterns 21 and 22 on the chip region displayed on the display screen 60 with a redundant via (double-cut via) 45 and a yield-enhancement redundant via 44, as shown in FIG. 11.

Figure 11:
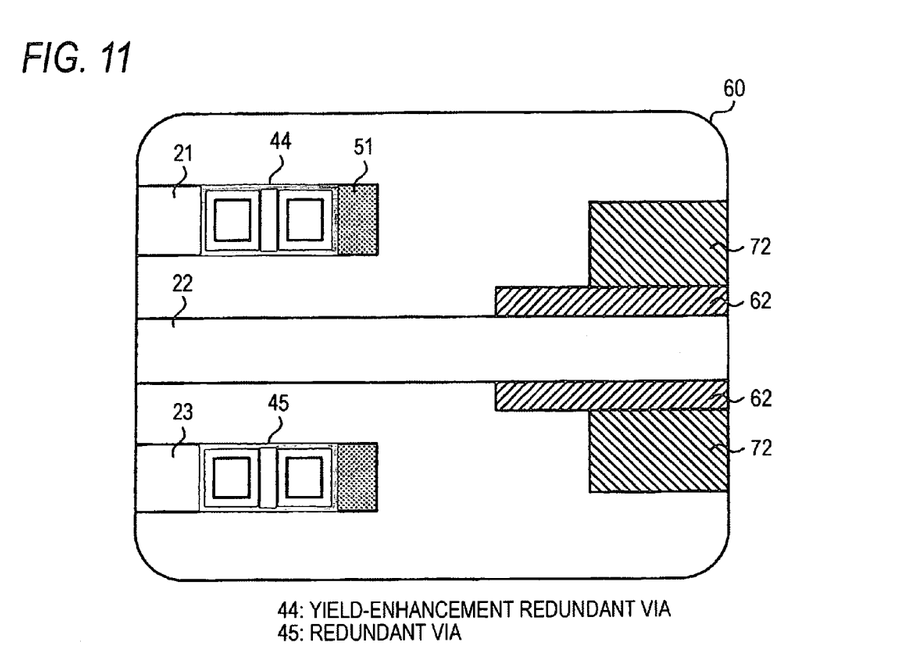
FIG. 11 is an example of a layout result performed by the automatic design device according to the second embodiment.
Figure 12:
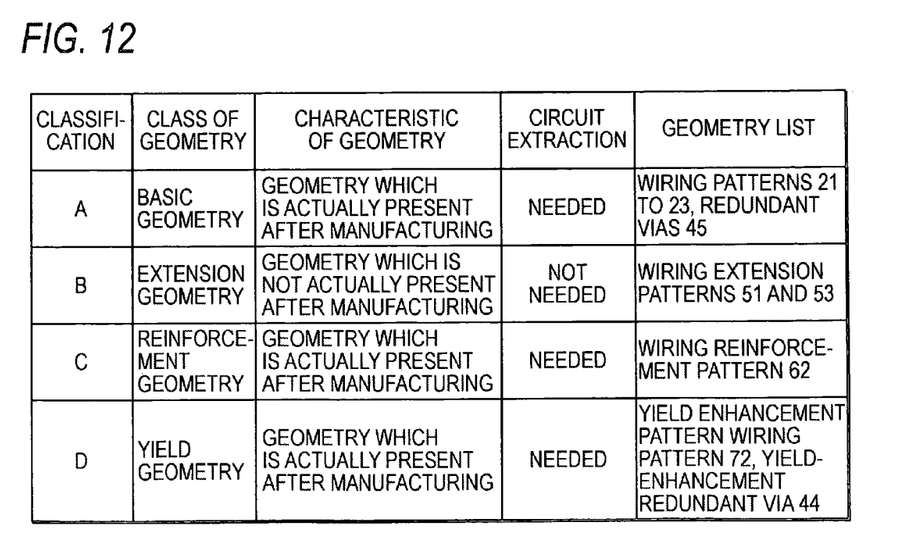
FIG. 12 is an exemplary table showing an example of a classification result of various geometric information performed by the automatic design device according to the second embodiment.

It is assumed that the redundant via 45 of FIG. 11 is geometric information which is set for electric property by a designer. As shown in FIG. 12, the classifying section 14 classifies geometric information of the redundant via 45 into a group A. It is assumed that the yield-enhancement redundant via 44 is geometric information which is added from a request in manufacture in order to enhance a yield. The classifying section 14 classifies geometric information of the yield-enhancement redundant via 44 into a group D. The classification result shown in FIG. 12 is stored in the classification storage section 34 of FIG. 10. The redundant via substituting storage section 37 stores constraint information for arranging the redundant via 45 and the yield-enhancement redundant via 44. Except for the above-described components, the automatic design device is substantially the same as that of FIG. 1.

An automatic design method for semiconductor integrated circuits using the automatic design device shown in FIG. 10 will be described with reference to a flow chart shown in FIG. 13. The process of the steps S10 to S23 is substantially the same as that of the steps S10 to S23 shown in FIG. 7. Therefore, the descriptions thereof will be omitted.

Figure 13:
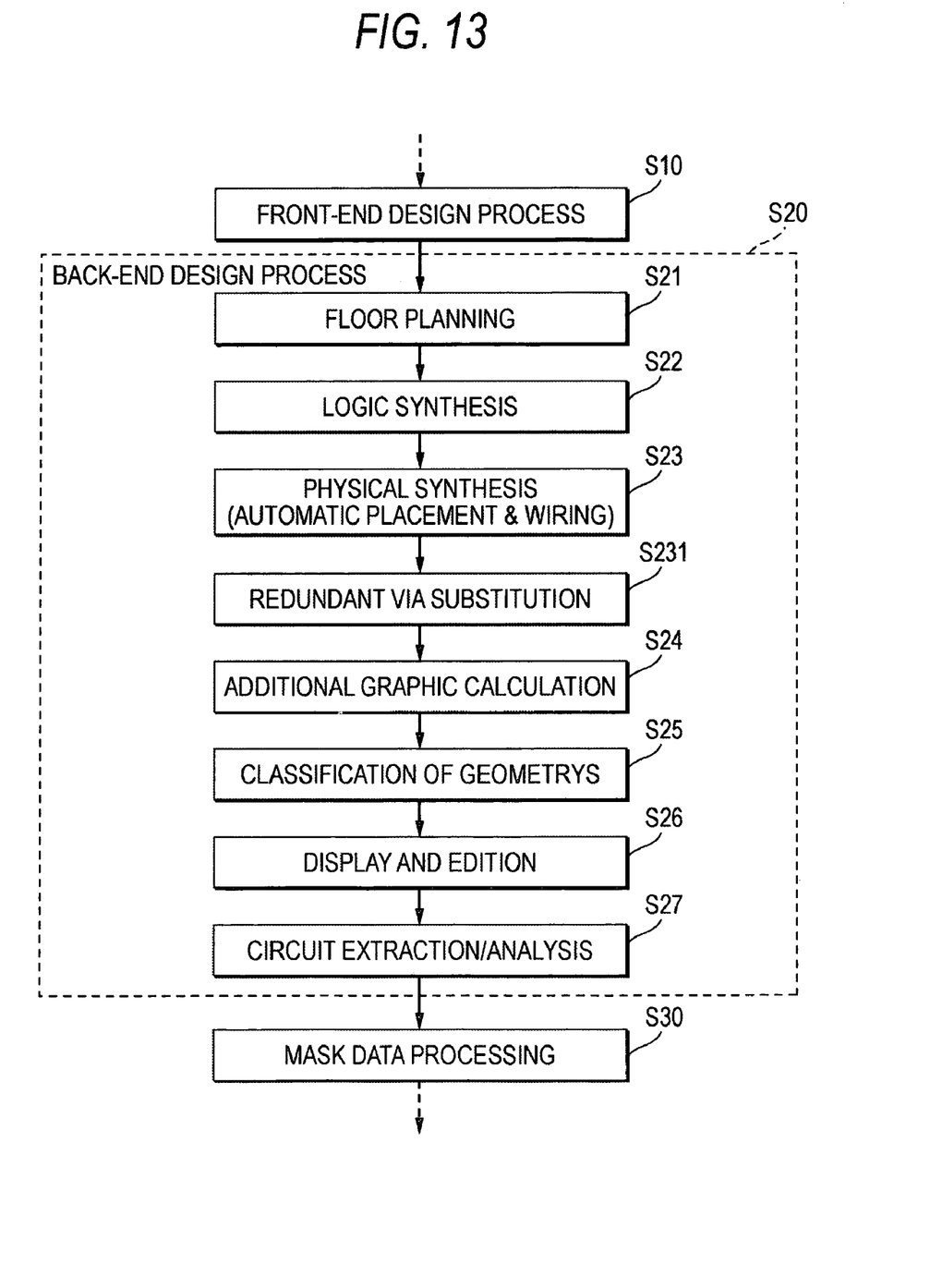
FIG. 13 is an exemplary flow chart showing an automatic design method according to the second embodiment.

(A) In step S231 of FIG. 13, the redundant via substituting section 17 reads the floor plan and the design constraint information stored in the data storing device 3 and the wiring result stored in the wiring storage section 32 and substitutes the via 41 shown in FIG. 3 with, for example, the redundant via 45 shown in FIG. 11. The substitution result of the redundant via 45 is stored in the wiring storage section 32.

(B) In step S24, the calculating section 13 reads the wiring result stored in the wiring storage section 32 and the graphic calculation rule stored in the geometry calculation rule storing section 33 so as to calculate additional geometric information including the wiring extension patterns 51 and 53, the wiring reinforcement pattern 62, and the yield enhancement wiring pattern 72 which are arranged in the chip region, as shown in FIG. 11. The calculation result of the additional geometric information is stored in the wiring storage section 32. At this time, the redundant via substituting section 17 substitutes the via 43 shown in FIG. 3 with the yield-enhancement redundant via 44 shown in FIG. 10. The substitution result is stored in the wiring storage section 32.

(C) In step S25, the classifying section 14 reads the information of the wiring patterns 21 to 23, the yield-enhancement redundant via 44, the redundant via 45, the wiring extension patterns 51 and 52, the wiring reinforcement pattern 62, and the yield enhancement wiring pattern 72, the information being stored in the wiring storage section 32. Then, the classifying section 14 classifies the information in accordance with the types and characteristics of the respective geometries, as shown in FIG. 12. The classification result is stored in the classification storage section 34.

(D) In step S26, the display editing section 15 reads the classification result stored in the classification storage section so as to display the wiring patterns 21, 22, and 23, the yield-enhancement redundant via 44, the redundant via 45, and the wiring extension patterns 51 and 53, the wiring reinforcement pattern 62, and the yield enhancement wiring pattern 72 on the display screen 60 of FIG. 11. In this case, the display editing section 15 displays the respective patterns by using different colors such that the pattern shapes thereof can be clearly discriminated. The display result is stored in the display storage section 35.

(E) In step S27, the analyzing section 16 reads the wiring result stored in the wiring storage section 32 and the classification result stored in the classification storage section. For example, the wiring extension patterns 51 and 53 classified into the group B among the respective patterns shown in FIG. 3 are such geometries that are not present on a substrate after manufacture. Therefore, the analyzing section 16 performs timing analysis by referring to only the information of the groups A, B, and D except for the wiring reinforcement patterns 51 and 53 and performs correction if necessary. The analysis result is stored in the analysis storing section 36. After that, the mask data processing is executed in the step S30, based on the analysis result stored in the analysis storing section 36.

According to the automatic design method of the second embodiment, the classifying section 14 classifies the information of the redundant via 45 and the yield-enhancement redundant via 44 to store in the classification storage section 34. Therefore, when the correction of redundant via is needed as a result of analysis, the correction can be effectively carried out, because the redundant via 45 which cannot be instantly edited in design can be discriminated from other redundant vias. Further, the display editing section 15 displays the design result by using different colors such that the pattern shapes and characteristics can be clearly discriminated on the display screen 60 shown in FIG. 11. Therefore, since a designer can clearly discriminate the additional geometries added from a request in manufacture and the additional geometries added from a request for circuit characteristics, it is possible to perform optimal design which satisfies both a request in manufacture and a request for circuit characteristics.

Although the invention has been described using the embodiments, it should not be understood that the descriptions and drawings composing a portion of the present disclosure limit the invention. Various substitutions, embodiments, and operation techniques will be clearly understood from the present disclosure by a person with an ordinary skill in the art. As such, it is natural that the invention includes various embodiments which are not described. Therefore, the scope of the invention is determined only by invention specifying items according to proper claims from the above descriptions.

According to the above-embodiments, it is possible to provide an automatic design device, an automatic design method, and an automatic design program, in which additional geometries added from a request in manufacture and additional geometries added from a request for circuit characteristics can be clearly discriminated with respect to basic geometries including wiring lines and vias such that design precision and design efficiency can be enhanced.

What is claimed is:

1. An automatic design device comprising:
    a calculating section that calculates a plurality of additional geometries added to a plurality of basic geometries including wiring lines and vias arranged on a chip region and stores the calculation result in a wiring storage section;
    a classifying section that reads the calculation result on the plurality of additional geometries from the wiring storage section, classifies the plurality of additional geometries into at least an additional geometry required for manufacture and an additional geometry required for circuit characteristics in accordance with a division and characteristics of the plurality of additional geometries in order to manufacture the basic geometries on the chip region, and stores the classification result into a classification storage section; and
    an analyzing section that extracts at least one of the plurality of additional geometries through the classification result in accordance with a purpose of analysis and analyzes characteristics of the basic geometries.

2. The automatic design device according to claim 1, wherein the additional geometry required for manufacture comprises an extension geometry serving as a geometric information added from a request in manufacture of the wiring pattern.

3. The automatic design device according to claim 1, wherein the additional geometry required for circuit characteristics comprises a basic graphic required to be actually present on the chip region of a semiconductor substrate after a semiconductor integrated circuit is manufactured.

4. The automatic design device according to claim 1, wherein the additional geometry required for manufacture is further classified into a first additional geometry required to be actually present on the chip region of a semiconductor substrate after a semiconductor integrated circuit is manufactured and a second additional geometry required to be actually not preset on the chip region of the semiconductor substrate after the semiconductor integrated circuit is manufactured.

5. The automatic design device according to claim 1, wherein the analyzing section extracts at least one of the plurality of additional geometries through the additional geometries required for circuit characteristics, the first additional geometry of the additional geometry required for manufacture, and the second additional geometry of the additional geometry required for manufacture in accordance with a purpose of analysis and analyzes characteristics of the basic geometries.

6. The automatic design device according to claim 1, wherein the calculating section includes:
    a reinforcement geometry calculating section that calculates a reinforcement graphic for enhancing productivity of the plurality of basic geometries by using a target mask data processing calculation rule for calculating the additional geometries; and
    a yield geometry calculating section that calculates a yield graphic for enhancing a yield of the plurality of basic geometries to which the reinforcement graphic is added.

7. The automatic design device according to claim 6, wherein the target mask data processing calculation rule is to selectively extract, based on the density of each pattern of the additional geometries, a specific pattern, which is difficult to actually manufacture on a semiconductor substrate after automatic design and add the additional geometries to the extracted pattern.

8. An automatic design method comprising:
calculating a plurality of additional geometries added to a plurality of basic geometries including wiring lines and vias arranged on a chip region;
storing the calculation result in a wiring storage section;
reading the calculation result on the plurality of additional geometries from the wiring storage section;
classifying the plurality of additional geometries into at least an additional graphic required for manufacture and an additional graphic required for circuit characteristics in accordance with a division and characteristics of the plurality of additional geometries in order to manufacture the basic geometries on the chip region;
storing the classification result into a classification storage section;
extracting at least one of the plurality of additional geometries through the classification result in accordance with a purpose of analysis and analyze characteristics of the basic geometries; and
displaying a wiring pattern of the chip region on a display device.

9. The automatic design method according to claim 8, wherein the additional graphic required for manufacture comprises an extension geometry serving as a geometric information added from a request in manufacture of the wiring pattern.

10. The automatic design method according to claim 8, wherein the additional graphic required for circuit characteristics comprises a basic graphic required to be actually present on the chip region of a semiconductor substrate after a semiconductor integrated circuit is manufactured.

11. The automatic design method according to claim 8, wherein the additional graphic required for manufacture is further classified into a first additional graphic required to be actually present on the chip region of a semiconductor substrate after a semiconductor integrated circuit is manufactured and a second additional graphic required to be actually not preset on the chip region of the semiconductor substrate after the semiconductor integrated circuit is manufactured.

12. The automatic design method according to claim 11, wherein said extracting is further through the additional graphic required for circuit characteristics, the first additional graphic of the additional graphic required for manufacture, and the second additional graphic of the additional graphic required for manufacture in accordance with a purpose of analysis and analyzes characteristics of the basic geometries.

13. The automatic design method according to claim 8, further comprising:
calculating a reinforcement graphic enhancing a productivity of the plurality of basic geometries by using a target mask data processing calculation rule for calculating the plurality of additional geometries, when the plurality of additional geometries are calculated; and
calculating a yield graphic enhancing a yield of the basic geometries to which the reinforcement graphic is added.

14. The automatic design method according to claim 13, wherein the target mask data processing calculation rule is to selectively extract, based on the density of each pattern of the additional geometries, a specific pattern, which is difficult to actually manufacture on a semiconductor substrate after automatic design and add the additional geometries to the extracted pattern.

15. A computer-readable medium containing instructions to instruct a computer to execute:
calculating a plurality of additional geometries added to a plurality of basic geometries including wiring lines and vias arranged on a chip region;
storing the calculation result in a wiring storage section;
reading the calculation result on the plurality of additional geometries from the wiring storage section;
classifying the plurality of additional geometries into at least an additional graphic required for manufacture and an additional graphic required for circuit characteristics in accordance with a division and characteristics of the plurality of additional geometries in order to manufacture the basic geometries on the chip region;
storing the classification result into a classification storage section;
extracting at least one of the plurality of additional geometries through the classification result in accordance with a purpose of analysis and analyze characteristics of the basic geometries; and
displaying a wiring pattern of the chip region to a designer.

16. The computer-readable medium according to claim 15, wherein the additional graphic required for manufacture comprises an extension geometry serving as a geometric information added from a request in manufacture of the wiring pattern.

17. The computer-readable medium according to claim 15, wherein the additional graphic required for circuit characteristics comprises a basic graphic required to be actually present on the chip region of a semiconductor substrate after a semiconductor integrated circuit is manufactured.

* * * * *